(12) United States Patent
Kobrin et al.

(10) Patent No.: US 7,687,110 B2
(45) Date of Patent: Mar. 30, 2010

(54) METHOD OF IN-LINE PURIFICATION OF CVD REACTIVE PRECURSOR MATERIALS

(75) Inventors: Boris Kobrin, Walnut Creek, CA (US); Romuald Nowak, Cupertino, CA (US); Jeffrey D. Chinn, Foster City, CA (US); Richard C. Yi, Santa Cruz, CA (US)

(73) Assignee: Applied Microstructures, Inc., San Jose, CA (US)

( * ) Notice: Subject to any disclaimer, the term of this patent is extended or adjusted under 35 U.S.C. 154(b) by 0 days.

(21) Appl. No.: 11/903,397

(22) Filed: Sep. 20, 2007

(65) Prior Publication Data

US 2008/0083329 A1 Apr. 10, 2008

Related U.S. Application Data

(62) Division of application No. 11/076,390, filed on Mar. 8, 2005.

(51) Int. Cl.
*C23C 16/00* (2006.01)
(52) U.S. Cl. .................................... 427/248.1
(58) Field of Classification Search .............. 427/8–10; 95/19, 241; 118/692; 96/174, 421
See application file for complete search history.

(56) References Cited

U.S. PATENT DOCUMENTS

| | | | | |
|---|---|---|---|---|
| 4,392,874 A | 7/1983 | Yamauchi | ................ | 55/194 |
| 4,398,925 A | 8/1983 | Trinh et al. | .................. | 55/15 |
| 4,711,647 A | 12/1987 | Gathmann | ................ | 55/52 |
| 4,717,596 A * | 1/1988 | Barbee et al. | ............. | 427/248.1 |
| 4,746,335 A | 5/1988 | Reimann et al. | .............. | 55/170 |
| 4,761,269 A | 8/1988 | Conger et al. | ................ | 422/245 |
| 5,098,741 A | 3/1992 | Nolet et al. | .............. | 427/248.1 |

(Continued)

FOREIGN PATENT DOCUMENTS

EP 0622475 11/1994

(Continued)

OTHER PUBLICATIONS

Ott et al, Atomic layer-controlled growth of transparent conducting ZnO on plastic substrates, Materials Chemistry and Physics, vol. 58, Issue 2, Mar. 25, 1999, p. 132-138.*

(Continued)

*Primary Examiner*—Timothy H Meeks
*Assistant Examiner*—Elizabeth Burkhart
(74) *Attorney, Agent, or Firm*—Martine Penilla & Gencarella, LLP (57) ABSTRACT

We have devised an apparatus useful for and a method of removing impurities from vaporous precursor compositions used to generate reactive precursor vapors from which thin films/layers are formed under sub-atmospheric conditions. The method is particularly useful when the layer deposition apparatus provides for precise addition of quantities of different combinations of reactants during a single step or when there are a number of different individual steps in the layer formation process, where the presence of impurities has a significant affect on both the quantity of reactants being charged and the overall composition of the reactant mixture from which the layer is deposited. The method is particularly useful when the vapor pressure of a liquid reactive precursor is less than about 250 Torr at atmospheric pressure.

10 Claims, 5 Drawing Sheets

U.S. PATENT DOCUMENTS

| | | | |
|---|---|---|---|
| 5,595,603 A | 1/1997 | Klinedinst et al. | 118/715 |
| 5,624,642 A | 4/1997 | Devanathan et al. | 422/140 |
| 5,772,736 A | 6/1998 | van Schravendijk et al. | 95/46 |
| 5,966,499 A * | 10/1999 | Hinkle et al. | 392/388 |
| 5,972,430 A | 10/1999 | DiMeo, Jr. et al. | 427/255.32 |
| 6,098,964 A | 8/2000 | Schmitt | 261/75 |
| 6,372,944 B1 | 4/2002 | Matsumoto et al. | 562/600 |
| 6,508,916 B1 | 1/2003 | Razzaghi et al. | 203/11 |
| 7,413,596 B2 * | 8/2008 | Platow et al. | 95/266 |
| 2005/0081787 A1* | 4/2005 | Im et al. | 118/715 |
| 2006/0005860 A1 | 1/2006 | Garcia | 134/26 |
| 2006/0121192 A1 | 6/2006 | Jurcik et al. | 427/248.1 |

FOREIGN PATENT DOCUMENTS

| | | |
|---|---|---|
| WO | WO 9835739 | 8/1998 |
| WO | WO 02092203 | 11/2002 |

OTHER PUBLICATIONS

T.N. Bell et al., "An Apparatus for Degassing Liquids by Vacuum Sublimation", Journal of Physical Chemistry, vol. 72, No. 13, pp. 4693-4695 (1968).

S.K. Saxena, "Process Vessel (Vapour-Liquid Separator) Sizing When Degassing Criteria Controls the Design", Chemical Engineering World, vol. XXXIV, No. 3, pp. 167-170 (Mar. 1999).

A.S.P. Solomon et al., "Flow and Atomization in Flashing Injectors", Atomisation and Spray Technology, vol. 1, pp. 53-76 (1985).

H.C. Van Ness et al., "A Procedure for Rapid Degassing of Liquids", Ind. Eng. Chem. Fundam., vol. 17, No. 1, pp. 66-67 (1978).

* cited by examiner

METHOD OF IN-LINE PURIFICATION OF CVD REACTIVE PRECURSOR MATERIALS

This application is a divisional application of application Ser. No. 11/076,390, filed Mar. 8, 2005, which is currently pending. This application is also related to application Ser. No. 10/759,857, filed January 17, 2004, published Dec. 30, 2004 as Publication No. US 2004/0261703 A1, and entitled: "Apparatus And Method For Controlled Application Of Reactive Vapors To Produce Thin Films And Coatings", which is hereby incorporated by reference. This application is also related to a series of patent applications pertaining to deposition of specialized coatings, including: application Ser. No. 10/862,047, filed Jun. 4, 2004, and entitled: "Controlled Deposition Of Silicon-containing Coatings Adhered By An Oxide Layer"; application Ser. No. 10/912,656, filed Aug. 4, 2004, and entitled: "Vapor Deposited Functional Organic Coatings"; and, application Ser. No. 10/996,520, filed Nov. 19, 2004, and entitled: "Controlled Vapor Deposition Of Multi-layered Coatings Adhered By An Oxide Layer". These related applications provide background for the present disclosure, and the content of these applications in hereby incorporated by reference in the entirety.

BACKGROUND OF THE INVENTION

1. Field of the Invention

The present invention pertains to apparatus and a method useful in the preparation of liquid precursor materials, prior to use of the precursor materials in vaporous form for layer deposition on a substrate.

2. Brief Description of the Background Art

Integrated circuit (IC) device fabrication, micro-electromechanical systems (MEMS) fabrication, and biosurface coating applications, all make use of layers of material which are deposited on a substrate for various purposes. In some instances, the layers are deposited on a substrate and then are subsequently removed, such as when the layer is used as a patterned masking material and then is subsequently removed after the pattern is transferred to an underlying layer. In other instances, the layers are deposited to perform a function in a device or system and remain as part of the fabricated device. Chemical vapor deposition is particularly useful in the formation of layers, where activated (e.g. by means of plasma, radiation, or temperature, or a combination thereof) species react either in a vapor phase (with subsequent deposition of the reacted product on the substrate) or react on the substrate surface to produce a reacted product on the substrate.

In applications where the wear on a surface layer is likely to occur due to mechanical contact or fluid flow over the substrate surface on which the layer of coating is present, it is helpful to have the coating chemically bonded directly to the substrate surface via reaction of the species with the surface in order to obtain particular surface properties. The same is typically true with respect to biosurface coatings which may be lifted from a substrate surface due to reactivity with a material contacting the biosurface. Due to the nanometer size scale of some electrical devices, and the use of MEMS and biosurface layers, where the type and properties of a coating layer on a substrate surface provide functionality on a molecular level, a need has grown for improved methods of controlling the formation of a layer on the substrate surface. Historically, these types of layers were deposited from a liquid phase, resulting in limited film property control and loss of device yield due to capillary forces. More recently, vapor-phase deposition has been used as an alternative, to provide improved coating properties.

Application Ser. No. 10/759,857, filed Jan. 17, 2004, and entitled: "Apparatus And Method For Controlled Application Of Reactive Vapors To Produce Thin Films And Coatings" describes the vapor deposition of various layers of coating materials. The present invention is helpful in the preparation of precursors used to form the coatings. The '857 application describes an improved vapor-phase deposition method and apparatus for the application of various layers on substrates. The method and apparatus are useful in the fabrication of electronic devices, micro-electromechanical systems (MEMS), Bio-MEMS devices, microfluidic devices, a biological surface coatings. The layer formation method typically employs a batch-like addition and mixing of all of the reactants to be consumed during formation of the layer. A coating formation process may be complete after one step, or may include a number of individual steps, where different or repetitive reactive processes are carried out in each individual step. Multiple layers may be deposited. The apparatus used to carry out the method provides for the addition of a precise amount of each of the reactants to be consumed in a single reaction step in which a layer is formed. The apparatus may provide for precise addition of quantities of different combinations of reactants during a single step or when there are a number of different individual steps in the coating formation process. The precise addition of each of the reactants is based on a metering system where the amount of reactant added in an individual step is carefully controlled. In particular, the reactant in vapor form is metered into a vapor reservoir (expansion volume) with a predetermined set volume at a specified temperature and pressure to provide a highly accurate amount of reactant. The entire measured amount(s) of each reactant is (are) transferred in batch fashion into the process chamber in which the coating is formed. The order in which each reactant is added to the chamber for a given reaction step is selectable, and may depend on the relative reactivities of the reactants when there are more than one reactant, the need to have one reactant or the catalytic agent contact the substrate surface first, or a balancing of these considerations.

In some instances, it may be necessary to carry out a series of individual vapor delivery steps to provide a complete coating, rather than carrying out one continuous reaction process. For example, all of a precisely measured quantity of one reacting component may be added initially, followed by a series of precisely measured quantities of a second reacting component. In each case all of the measured quantity is added to the reaction chamber. This provides a precise, carefully measured quantity of reactant at a precise time for each reactant.

A computer driven process control system may be used to provide for a series of additions of reactants to the process chamber in which the layer or coating is being formed. This process control system typically also controls other process variables, such as, (for example and not by way of limitation), process time, chamber pressure, temperatures of the process chamber and the substrate to which the coating is applied, as well as temperatures of the vapor delivery lines and vapor reservoirs relative to the temperatures of the precursors.

The apparatus for vapor deposition of layers, including multi-layered coatings, is particularly useful where at least one precursor used for formation of a layer exhibits a low vapor pressure. Typically the precursor is in the form of a liquid. In some instances the precursor may be in the form of a solid which must be heated to form a liquid. At least one precursor, in the form of a liquid or solid, is provided in a supply vessel, typically referred to as a supply cylinder; vapor from the at least one precursor is transferred to at least one precursor vapor reservoir for accumulating a desired nominal amount of vapor and holding the vapor until it is charged to a reaction chamber. A process controller which receives data from a pressure sensor associated with the precursor vapor reservoir compares vapor reservoir pressure data with a desired nominal vapor reservoir pressure, and sends a signal to a device which controls vapor flow from the precursor container into the precursor vapor reservoir, to prevent further vapor flow into the precursor vapor reservoir when the desired nominal pressure is reached. Each precursor vapor used in formation of a layer of coating material is subsequently transferred to a process chamber for vapor deposition of the coating on a substrate present in the process chamber.

To ensure that a coating having desired nominal and uniform physical properties is obtained, it is advantageous to remove impurities from precursor materials which are used to produce the layers. When the layers are produced by controlled deposition from at least one vaporous precursor, it is necessary to remove impurities from the vaporous precursor. U.S. Pat. No. 5,595,603, to Klinedinst et al., issued Jan. 21, 1997, describes an apparatus and method for the controlled delivery of vaporized precursor to a low pressure chemical vapor deposition (LPCVD) reactor. A liquid flow controller is closely coupled with a liquid vaporizer. The liquid flow controller employs a gas-liquid separator down-stream of the flow control element, which is said to assure that an uninterrupted constant velocity flow of liquid enters the high-temperature zone of the vaporizer. The output of the vaporized-precursor delivery system is linked with the gas inlet of an LPCVD reactor. The system is said to provide very precise vapor delivery rates, leading to precisely controlled thin film deposition rates. (Abstract) The disclosure focuses on flow control of precursor liquid to a vaporization source and vaporization of the liquid precursor. There is no discussion regarding the potential presence of undesired impurities in the liquid precursor. There is one embodiment in which the container of liquid precursor is pressurized by a source of inert gas and where it is acknowledged that a quantity of dissolved inert gas is present in the liquid. A gas/liquid phase separator is used for separating the dissolved inert gas from the flow of liquid precursor. The liquid flows from the gas/liquid phase separator to a liquid vaporizer, and from there to the LPCVD reactor.

U.S. Pat. No. 5,772,736 to van Schravendijk et al, issued Jun. 30, 1998, describes a device for removing dissolved gas from a liquid. An apparatus and a method for delivering a liquid are disclosed. A liquid contained in a vessel is subjected to a pressurized gas. Any pressurized gas dissolved in the liquid is removed in a degas module by passing the liquid through a gas permeable tube subjected to a pressure differential. Then the liquid is dispensed by a liquid mass flow controller. (Abstract)

European Patent Application 94302468.7, published as Publication Number 0 622 475 A1 on Nov. 2, 1994, describes a method and apparatus for degassing semiconductor processing liquids. The apparatus comprises a housing and degasser within the housing. The housing also includes fluid inlet/outlet openings connected to the degasser through which the processing liquid is passed. The degasser includes a separator in the form of a circular pipe defining a tortuous (preferably spiral) path for the processing fluid as it passes through the housing. The separator is configured to be pervious to the molecules of the entrapped or dissolved gas but impervious to the molecules of the liquid. Typically the housing can be evacuated to create a pressure differential across the separator.

An article published in Chemical Engineering World, Vol. XXXIV No. 3, March 1999, pp. 167-170, by S. K. Saxena discussed process vessel (vapor-liquid separator) sizing when degassing criteria controls the design of the vessel. This paper particularly relates to vapor-liquid separators where separation in a process vessel is accomplished either by virtue of density difference aided by gravitation force, impingement separation or both.

The design of the vapor-liquid separators described above is relatively complicated, which is due at least in part to the need to have a continuous flow of liquid to a downstream process. The present inventors are co-inventors of the '857 application which was previously discussed above. The present application and the '857 application are both assigned to Applied Microstructures of San Jose, Calif. The precursors used to produce the reactive vapors which form the thin films/layers of the kind described in the '857 application contain impurities. These impurities commonly become entrapped or otherwise present in the reactive vapors produced from the precursors. As a result, when a given amount of reactive vapor is charged to a processing chamber in which the coating is formed on a substrate, due to the impurity content of the vapor, there may not be sufficient reactant to produce full coverage of the substrate surface by the deposited layer. Further, the impurities may affect the chemical composition and physical properties of the deposited layer. Some suppliers package precursors under a nitrogen atmosphere to prevent decomposition of the precursors. This increases the problem of the presence of impurities in the precursors, which impurities become part of the vapor produced from the precursors. There is a need for a reliable and easily managed method of removing impurities from liquid precursor materials used to generate reactive vapors from which a thin film or layer is formed.

SUMMARY OF THE INVENTION

We have devised an apparatus useful for and a method of removing impurities from liquid precursor materials used to generate reactive precursor vapors from which thin films and layers are formed on a substrate. The apparatus is easily integrated into the apparatus used in the layer deposition process. The method is particularly useful when the deposition process provides for precise addition of quantities of different combinations of reactants during a single step or when there are a number of different individual steps in the layer formation process, where the presence of impurities has a significant effect on both the quantity of reactant being charged and the overall composition of the reactant from which the layer is generated.

The apparatus includes at least one precursor composition containment vessel which is in communication with a limited volume chamber which is, at least initially, at a lower pressure than the vapor pressure in the precursor composition containment vessel. The limited volume chamber is in communication with a pressure sensor, which communicates with a control system which compares a pressure in the limited volume container with an indicated, nominal pressure or change in pressure. The limited volume chamber includes an exhaust opening from which vapor is exhausted in response to output from the control system. Vapor generated from the precursor composition containment vessel is processed through the apparatus until the pressure in the limited volume container is sufficiently close to that of a desired pressure to indicate that the precursor material remaining in the precursor composition containment vessel is satisfactory for use as a reactant precursor material. To achieve a very high purification of the liquid precursor composition, the temperature at which the liquid precursor composition is processed is at least within about 10° C. of the boiling point of the liquid precursor composition at the pressure which is initially present in the limited volume container (generally the expansion volume) into which precursor composition vapor is collected. However, due to the potential for loss of significant amounts of precursor composition in the name of obtaining high purity, the processing of the precursor composition is more typically carried out at a lower temperature, where the precursor composition is capable of producing sufficient vapor to achieve a rate of increase in pressure in the expansion volume which ranges between about 0.5 to about 4 Torr/second, preferably in the range of about 1 Torr/second. In some instances, where the vapor pressure of the liquid precursor composition is particularly low, the temperature of the liquid precursor composition is increased to the maximum temperature which will not harm the precursor composition and the vapor production rate which results must be accepted.

The apparatus and method of the invention are particularly useful when the vaporous reactant precursor materials used to form a layer are generated from a liquid precursor supply which has a vapor pressure of about 250 Torr or less at 25° C. However, the apparatus and method may be used for liquid precursors which exhibit a higher vapor pressure as well.

The method relates to the removal of dissolved gases and gases which cohabit a supply vessel containing a reactant precursor, where the gases have a vapor pressure higher than the vapor pressure of the reactant precursor. The method also relates to the removal of lower molecular weight impurities (which have a higher vapor pressure) from the precursor composition to produce a reactant precursor of increased purity. A preferred embodiment of the method and apparatus are present in-line (integrated with) the apparatus and method used to deposit the layer. The method can be used in-line when at least one process vessel which is downstream of a precursor composition supply vessel operates at a pressure which is lower than the pressure in the precursor composition supply vessel. Typically, the at least one process vessel which is at a lower pressure is at sub-atmospheric pressure. Often, the pressure downstream of the precursor composition supply vessel is in the range of about 20 mTorr to about 100 mTorr, where "about" indicates ±20%.

The removal of constituents other than the desired reactant precursor from the precursor composition supplied by a vendor is especially important when precise quantities of the reactant precursor need to be charged to a reaction process from which a thin film/layer is deposited on a substrate surface.

To remove impurities from a liquid precursor composition supplied from a vendor, the portion of the precursor composition present in a vapor space above the composition is typically expanded through an aperture into a limited, confined volume which is initially at a lower pressure than the vapor pressure in a container of precursor composition. The aperture is commonly a conduit, or a path through a valve. A valve may be selected from available valves such as a solid wedge gate valve, a flexible wedge gate valve, a globe valve, a diaphragm valve, a ball valve, a butterfly valve, and a needle valve, by way of example and not by way of limitation. A control valve of a kind known in the art may be used, where an actuator is used in combination with at least one valve. The pressure in the limited, confined volume is then compared with the vapor pressure of the reactant precursor of a nominal, desired purity, at the same temperature as that of the vaporous material in the limited volume. If the vapor pressure in the limited volume exceeds the vapor pressure which would be produced by the nominal purity reactant precursor, the vaporous material collected in the limited volume is then discarded and the vapor space precursor expansion, collection, and comparative process is repeated until the vapor pressure in the limited volume is sufficiently close to that of the nominal purity reactant precursor. Whether the vapor pressure is sufficiently close depends on the tolerance for impurities in the precursor material being used to deposit a layer. At some point, as the composition of the collected vaporous material in the limited volume approaches that of a pure reactant precursor, it becomes impractical to continue the removal of impurities, due to the cost of reactant precursor being discarded.

Once the desired purity of reactant precursor is reached, the vapor of the reactant precursor generated from the precursor composition in the container vessel is available to be used to deposit a layer on a substrate. A series of layers may be deposited on substrates without any further removal of impurities, until such time as there is an indication that the precursor composition is not providing adequate vapor quantities within the expected time period. This is an indication that the precursor composition has been used up, or that the precursor composition has changed in a manner which is not acceptable, and the material remaining in the precursor composition containment vessel is not pure reactant precursor. At that time, the container vessel is removed and replaced with a new container vessel full of precursor composition, or the precursor composition remaining in the containment vessel is discarded and replaced with new precursor composition.

In instances where the vapor pressure of the precursor composition supplied by the vendor is sufficiently high that the composition tends to foam upon expansion through an aperture, such that there is a danger of flooding downstream processing apparatus in a harmful manner, it may be necessary to cool the precursor composition prior to following the procedure for removing impurities. In some instances, a cooled precursor composition may be used for generation of reactant precursor vapors. For particularly high vapor pressure precursor compositions, it may be necessary to freeze the precursor composition; remove the vapor in the precursor composition container vessel by expansion through an aperture into a lower pressure confining environment; thaw the precursor composition to generate more vapor in the precursor composition container vessel; and, to repeat this process a series of times, until the vapor pressure of the thawed precursor composition in the container vessel is within an acceptable range.

In some instances, the precursor composition may be warmed as impurities are removed and the vapor pressure of the precursor composition lowers, until such time that the purified precursor composition meets the requirements to be used for generation of reactant precursor vapors. The precursor composition may be warmed from as low as about 10° C. above room temperature to a temperature in the range of 150° C., where the upper temperature limitation may be based on stability of the precursor composition.

The essential steps in the method typically include the following:

a) passing a vapor from a vapor space of said liquid precursor composition through at least one aperture in a manner such that the precursor composition vapor expands into a lower pressure, confining environment;

b) collecting the precursor composition vapor in the confining environment;

c) sensing a pressure of the precursor composition vapor in the confining environment;

d) comparing said sensed pressure with an indicated nominal pressure or with a change in pressure; and, e) exhausting the precursor composition vapor from the confining environment when the precursor composition vapor does not meet requirements with respect to the indicated nominal pressure or change in pressure.

Steps a) through e) may be repeated a number of times to remove impurities from the liquid precursor composition.

Once the precursor composition vapor in the confining environment meets requirements, the precursor composition may be warmed even further, up to the working temperature required in the coating deposition process, so that vapor will be generated more rapidly from the precursor composition.

BRIEF DESCRIPTION OF THE DRAWINGS

FIG. 1 shows the apparatus as described in U.S. patent application Ser. No. 10/759,857, which was filed prior to the present invention. FIG. 1 does not show a portion of the apparatus elements of the present invention which are located between the source of the precursor material and the coating process chamber. The additional apparatus elements are shown in FIGS. 2A and 2B.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise. In addition, the use of the word "about" indicates that the value is within plus or minus 20%.

We have devised an apparatus useful for and a method of removing impurities from liquid precursor compositions used to generate reactive precursor vapors from which thin films/layers are formed. The method is particularly useful when the layer deposition apparatus provides for precise addition of quantities of different combinations of reactants during a single step or when there are a number of different individual steps in the coating formation process, where the presence of impurities affects both the quantity of reactant precursor being charged and the overall composition and relative amounts of the reactants from which the layer is generated.

I. An Example Apparatus for the Removal of Vaporous Impurities from Reactive Vapor Deposition Precursor Materials As a background for relating the present invention to its intended use, and so that one skilled in the art will better understand variations of apparatus which may be used to carry out the present method of precursor preparation, we would like to describe one kind of layer deposition apparatus which may be used in combination with the apparatus of the present invention. In many instances, elements of the present inventive apparatus may be incorporated directly into a layer deposition apparatus, so that a portion of the elements of the layer deposition apparatus substitute directly for a portion of the elements of the present inventive apparatus.

Figure 1:
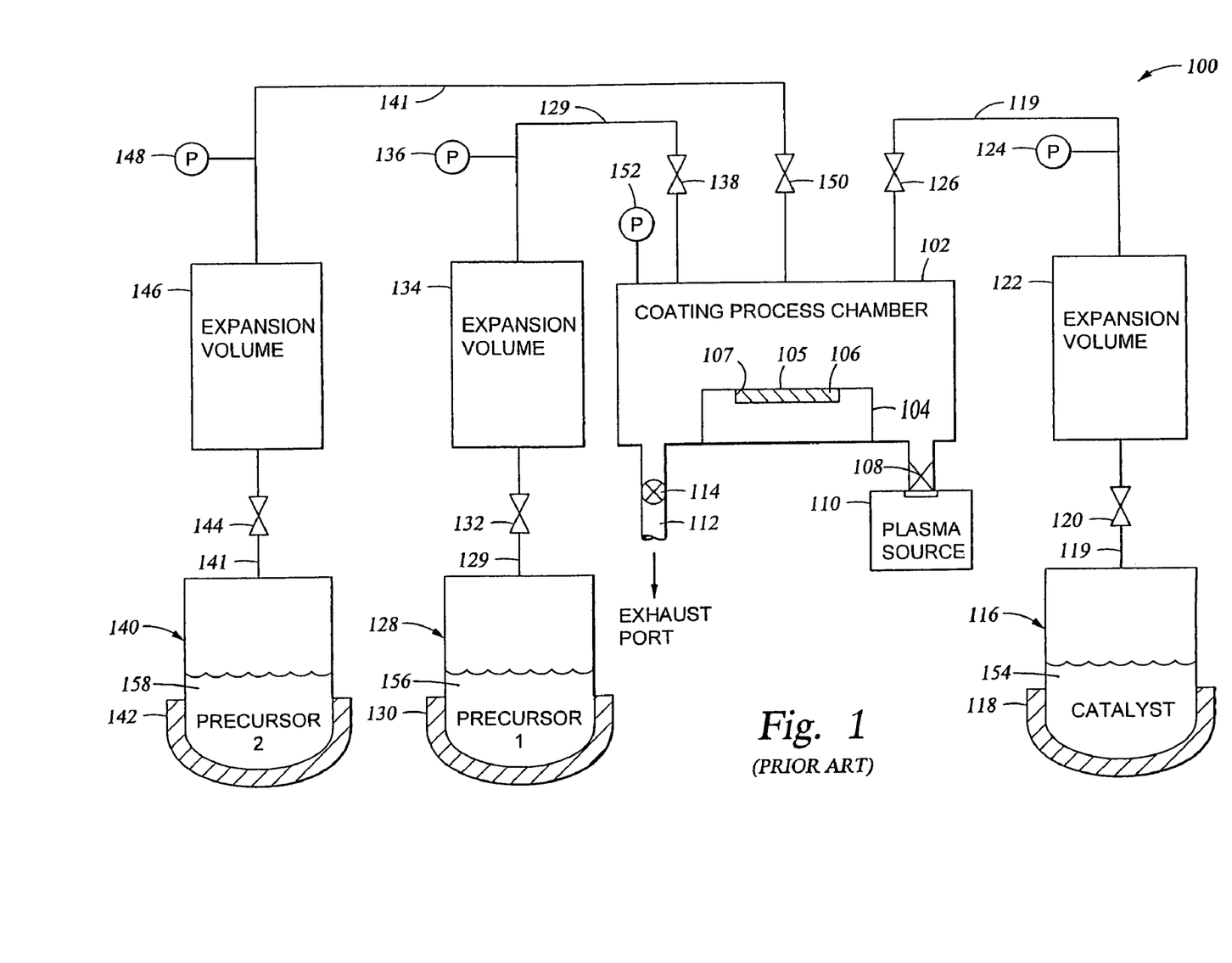
FIG. 1 shows a cross-sectional schematic of an apparatus 100 for vapor deposition of a coating, which apparatus provides for metering precise amounts of reactants to the coating formation process.

FIG. 1 shows a cross-sectional schematic of an apparatus 100 for vapor deposition of thin film layers and coatings. FIG. 1 is taken from U.S. application Ser. No. 10/759,857, which was filed prior to the present invention and which has been incorporated by reference herein. FIG. 1 shows an apparatus 100 for general layer deposition, but does not show the apparatus elements which are used to carry out the present invention. The apparatus 100 includes a process chamber 102 in which film layers and coatings are vapor deposited. A substrate 106 to be coated rests upon a substrate holder 104, often within a recess 107 in the substrate holder 104. Depending on the chamber design, the substrate 106 may rest on a substrate holder or may be placed on the chamber bottom (not shown in this position in FIG. 1). Attached to process chamber 102 is a remote plasma source 110, connected via a valve 108. Remote plasma source 110 may be used to provide a plasma which is used to clean and/or convert a substrate surface to a particular chemical state prior to application of a coating (which enables reaction of coating species and/or catalyst with the surface, thus improving adhesion and/or formation of the coating); or may be used to provide species helpful during formation of the coating (not shown) or modifications of the coating after deposition. The plasma may be generated using a microwave, DC, or inductive RF power source, or combinations thereof. The process chamber 102 makes use of an exhaust port 112 for the removal of reaction byproducts and is opened for pumping/purging the chamber 102. A shut-off valve or a control valve 114 is used to isolate the chamber or to control the amount of vacuum applied to the exhaust port. The vacuum source is not shown in FIG. 1.

The apparatus 100 shown in FIG. 1 is illustrative of an apparatus used for vapor depositing of layers which employs two precursor materials and a catalyst. One skilled in the art will understand that one or more precursors and from zero to multiple catalysts may be used during vapor deposition of a coating. A catalyst storage container 116 contains catalyst 154, which may be heated using heater 118 to provide a vapor, as necessary. It is understood that precursor and catalyst storage container walls, and transfer lines into process chamber 102 will be heated as necessary to maintain a precursor or catalyst in a vaporous state, minimizing or avoiding condensation. The same is true with respect to heating of the interior surfaces of process chamber 102 and the surface of substrate 106 to which the coating (not shown) is applied. A control valve 120 is present on transfer line 119 between catalyst storage container 116 and catalyst vapor reservoir (expansion volume) 122, where the catalyst vapor is permitted to accumulate until a nominal, specified pressure is measured at pressure indicator 124. Control valve 120 is in a normally-closed position and returns to that position once the specified pressure is reached in catalyst vapor reservoir (expansion volume) 122. At the time the catalyst vapor in vapor expansion volume 122 is to be released, valve 126 on transfer line 119 is opened to permit entrance of the catalyst present in vapor expansion volume 122 into process chamber 102 which is at a lower pressure. Control valves 120 and 126 are controlled by a programmable process control system of the kind known in the art (which is not shown in FIG. 1).

A Precursor 1 storage container 128 contains coating reactant Precursor 1, which may be heated using heater 130 to provide a vapor, as necessary. As previously mentioned, Precursor 1 transfer line 129 and vapor reservoir (expansion volume) 134 internal surfaces are heated as necessary to maintain Precursor 1 in a vaporous state, avoiding condensation. A control valve 132 is present on transfer line 129 between Precursor 1 storage container 128 and Precursor 1 vapor reservoir (expansion volume) 134, where the Precursor 1 vapor is permitted to accumulate until a nominal, specified pressure is measured at pressure indicator 136. Control valve 132 is in a normally-closed position and returns to that position once the specified pressure is reached in Precursor 1 vapor expansion volume 134. At the time the Precursor 1 vapor in vapor expansion volume 134 is to be released, valve 138 on transfer line 129 is opened to permit entrance of the Precursor 1 vapor present in vapor expansion volume 134 into process chamber 102, which is at a lower pressure. Control valves 132 and 138 are controlled by a programmable process control system of the kind known in the art (which is not shown in FIG. 1).

A Precursor 2 storage container 140 contains coating reactant Precursor 2, which may be heated using heater 142 to provide a vapor, as necessary. As previously mentioned, Precursor 2 transfer line 141 and vapor reservoir (expansion volume) 146 internal surfaces are heated as necessary to maintain Precursor 2 in a vaporous state, avoiding condensation. A control valve 144 is present on transfer line 141 between Precursor 2 storage container 146 and Precursor 2 vapor reservoir (expansion volume) 146, where the Precursor 2 vapor is permitted to accumulate until a nominal, specified pressure is measured at pressure indicator 148. Control valve 144 is in a normally-closed position and returns to that position once the specified pressure is reached in Precursor 2 vapor expansion volume 146. At the time the Precursor 2 vapor in vapor expansion volume 146 is to be released, valve 150 on transfer line 141 is opened to permit entrance of the Precursor 2 vapor present in vapor expansion volume 146 into process chamber 102, which is at a lower pressure. Control valves 144 and 150 are controlled by a programmable process control system of the kind known in the art (which is not shown in FIG. 1).

During formation of a coating (not shown) on a surface 105 of substrate 106, at least one incremental addition of vapor equal to the vapor expansion volume 122 of the catalyst 154, or the vapor expansion volume 134 of the Precursor 1, or the vapor expansion volume 146 of Precursor 2 may be added to process chamber 102. The total amount of vapor added is controlled by both the adjustable volume size of each of the vapor reservoirs (typically, and not by way of limitation, about 10% up to about 100% of the process chamber 102 volume) and the number of vapor injections (doses) into the reaction chamber. Further, the process control system (not shown) may adjust the set pressure 124 for catalyst vapor expansion volume 122, or the set pressure 136 for Precursor 1 vapor expansion volume 134, or the set pressure 148 for Precursor 2 vapor expansion volume 146, to adjust the amount of the catalyst or reactant added to any particular step during the coating formation process. This ability to fix precise amounts of catalyst and coating reactant precursors dosed (charged) to the process chamber 102 at any time during the coating formation enables the precise addition of quantities of precursors and catalyst at precise timing intervals, providing not only accurate dosing of reactants and catalysts, but repeatability in terms of time of addition.

This apparatus provides a very inexpensive, yet accurate method of adding vapor phase precursor reactants and catalyst to the coating formation process, despite the fact that many of the precursors and catalysts are typically relatively non-volatile materials. In the past, flow controllers were used to control the addition of various reactants; however, these flow controllers may not be able to handle some of the precursors used for vapor deposition of coatings, due to the low vapor pressure and chemical nature of the precursor materials. The rate at which vapor is generated from some of the precursors is generally too slow to function with a flow controller in a manner which provides availability of material in a timely manner for the vapor deposition process.

The apparatus shown in FIG. 1 allows for accumulation of reactive precursor vapor of an adequate quantity which can be charged (dosed) to a layer deposition reaction. In the event it is desired to make several doses during the progress of the coating deposition, the apparatus can be programmed to do so, as described above. Additionally, adding of the reactant precursor vapors into the reaction chamber in controlled aliquots (as opposed to continuous flow using a carrier gas) greatly reduces the amount of the reactants used and the cost of the coating process.

The present invention pertaining to precursor composition processing, to improve reactant precursor purity, is not limited to the use of the particular apparatus which is referenced above as a preferred embodiment example. The precursor composition purification process may also be used where a layer is deposited from a vapor deposition system which makes use of a continuous flow of reactant precursor vapor in the deposition process chamber. Typically, a continuous flow system makes use of a reactant precursor vapor in combination with a carrier gas. The precursor composition processing to provide a reactant precursor would typically (not by way of limitation) be carried out prior to addition of the carrier gas to the reactant precursor.

One factor which is extremely important is that the reactive precursor be of sufficient purity that the amount of reactive precursor charged to coating process chamber 102 is correct.

This can be a problem when the precursor composition purchased from vendors varies from batch to batch or from vendor to vendor. In addition, even if the precursor composition is consistent as received, the presence of gaseous contaminants and liquid impurities present in the liquid precursor affect the actual quantity of the reactant precursor delivered to process chamber 102. We experienced problems in layer deposition due to the presence of such gaseous and liquid contaminants in the liquid precursors. This led to development of the present method of preparation for reactant precursors and an apparatus to carry out the method. The apparatus illustrated is for purposes of example, and one skilled in the art will be able to envision variations on the apparatus which will be helpful depending on other apparatus which is used in combination with the reactive precursor preparation apparatus. For example, the apparatus shown is a basic system which does not show automation capability which can be easily incorporated by one skilled in the art of chemical engineering. One of skill in the art can purchase off the shelf a programmed control system which will sense pressures, compare these pressures to a set point pressure or pressure range and open and close valves in response to the sensed pressures. These pressure sensing systems may integrate incoming data and provide an indication of rate of pressure increase or decrease. Valves can be controlled in series, where the series of valves opened and closed depends on the sensed pressures. The programmed control system may include a feature which permits the operator to adjust set points, ranges and the series of sequential operations to be carried out in view of the precursor composition which is to be processed.

Figure 2A:
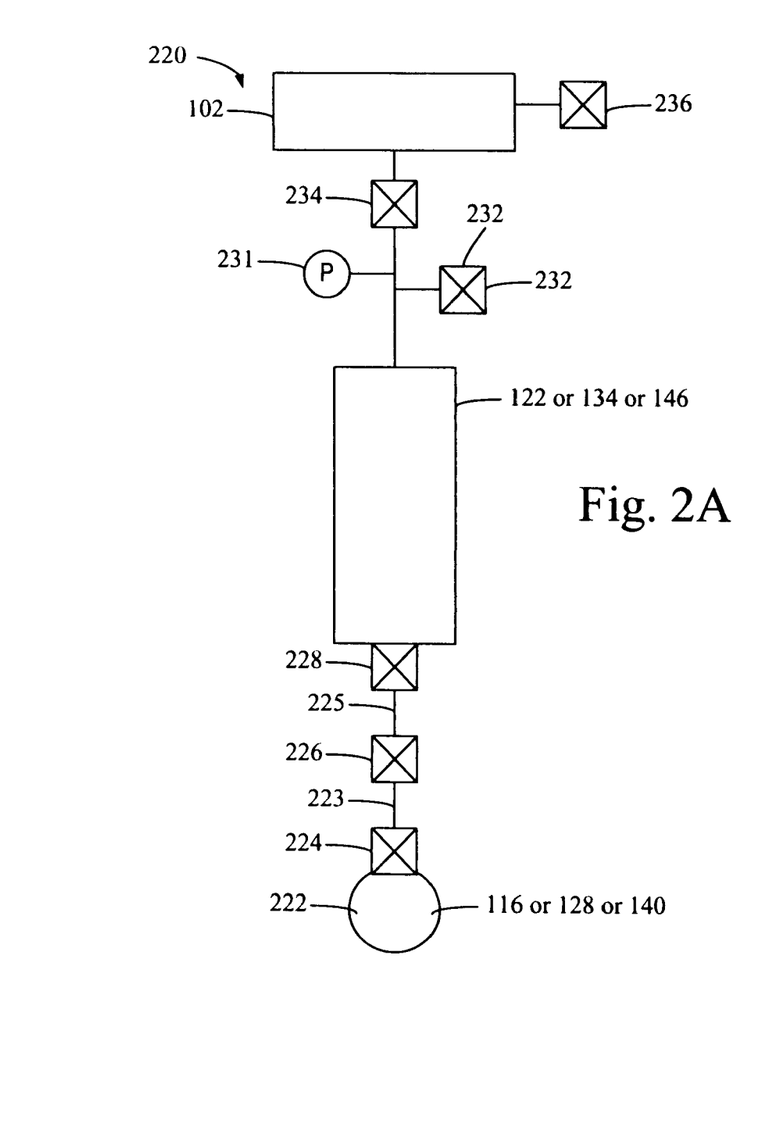
FIG. 2A shows a schematic view of an apparatus 220 which can be used to remove gaseous impurities from a vapor generated from a liquid precursor. The expansion volume 122, 134, or 146 of the kind shown in FIG. 1 is used as a limited volume chamber for purposes of the removal of gaseous impurities, prior to use of the expansion volume to collect vapors for charging to coating deposition process chamber 102. Gaseous impurities may be collected into and discharged from the expansion volume through a bypass line 232. Or, as an alternative to using a bypass line for discharge, the gaseous impurities may be directed through a process chamber 102 of the kind shown in FIG. 1 for discharge, where both the expansion volume and the process chamber 102 are heated to prevent condensation of the gaseous impurities. In some instances, there may be no expansion volume apparatus 122, 134, or 146, or bypass line 232, or valve 234 present in the processing apparatus 220, and the gaseous impurities generated from the liquid precursor composition may be passed directly to a process chamber 102 which acts as the limited volume chamber for purposes of the removal of impurities.
Figure 2B:
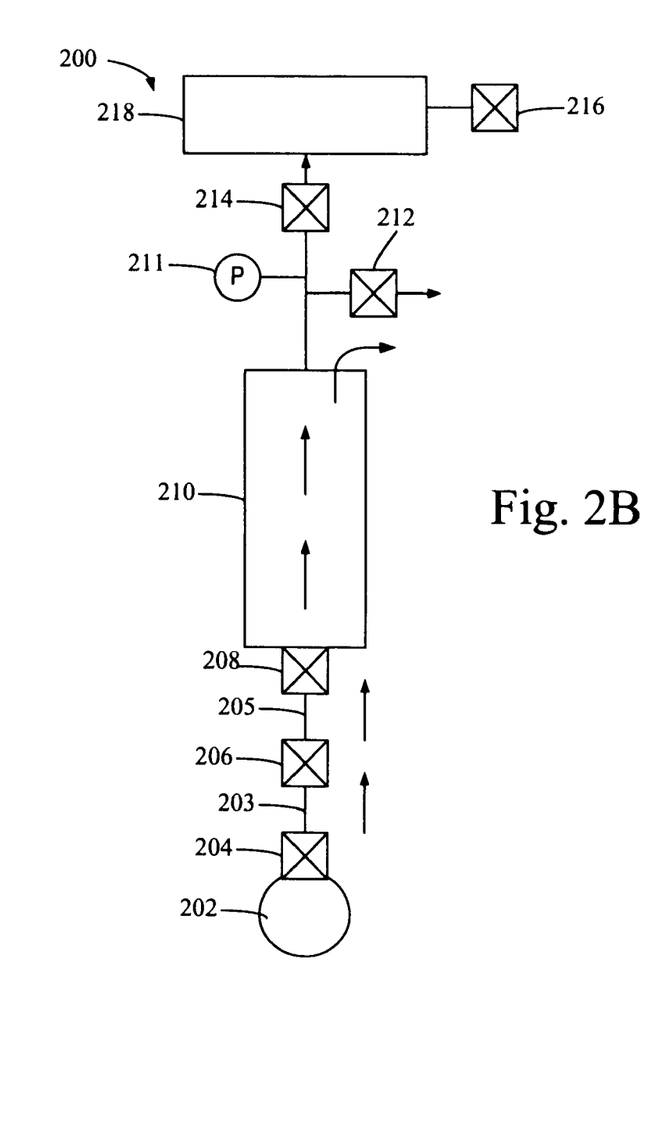
FIG. 2B shows a schematic view of an alternative embodiment apparatus 200, where gaseous impurities are collected into and discharged from a limited volume chamber 210 which is independent of the expansion volumes shown in FIG. 1. The impurities may then be discarded via a bypass line 212. In the alternative, the impurities may be passed through a heated (to avoid condensation) expansion volume or processing chamber 218 prior to discharge.

FIG. 2A shows one embodiment apparatus of the kind which is used to carry out the present method of invention. In FIG. 2A, elements of the apparatus of the present invention have been incorporated (placed in-line) into the apparatus shown in FIG. 1. Valves 120, 132, and 144 each have been replaced by a combination of valves. For example, with respect to valve 132 in FIG. 1, this valve is replaced by valves 224, 226, and 228, where valve 226 is optional, depending on the precursor composition which is being purified. FIG. 2B shows another embodiment apparatus, which may be used independently for purposes of purification of a precursor composition, where a reactant precursor produced from the precursor composition is subsequently sent to a chamber 218. Chamber 218 may be a general gaseous impurity collection chamber or may be a vapor reservoir/expansion volume 122 or 134 or 146, of the kind shown in FIG. 1.

In FIG. 2A, the apparatus 220 includes a supply vessel 222, which may be a container provided by a supplier, or which may be a precursor holding vessel 116, 128, or 140 of the kind which is shown in FIG. 1, which is periodically emptied and refilled with a precursor composition. In direct communication with supply vessel 222 is a valve 224 which is typically a shut off valve, which is used when complete isolation of the supply vessel 202 is required. However, the shut off valve 224 may be used to provide an aperture (not shown) through which gaseous materials present in a vapor space over a liquid precursor composition are passed, as a part of the present method of purifying a precursor composition, to produce a nominally pure reactive precursor for use in a layer deposition. More often, shut off valve 224 is used in full open position during precursor composition processing, and a second, downstream variable aperture valve is used to provide an aperture which is more precisely controlled. The purpose of the variable aperture valve is typically to prevent foaming of liquid precursor into apparatus which is downstream from the supply vessel, and to reduce entrainment of liquid precursor in the vapor which is being drawn off of the vapor space over the precursor composition.

The variable aperture valve may be a single valve or may be a series of valves, depending on the range in vapor pressures of precursor compositions which may be used in the apparatus. FIG. 2A shows two valves in series which make up a variable aperture valve, by way of example and not by way of limitation. In FIG. 2A, a first variable aperture valve 226 is shown which may be used alone or in combination with a second variable aperture valve, referred to as restrictor valve 228. In some instances, where the vapor pressure of a precursor composition is relatively high, typically greater than about 150 Torr, there is a need for a variable aperture valve which can tightly restrict the flow passing through the aperture, and this valve is represented by restrictor valve 228. The first variable aperture valve 226 may be used to "knock down" foaming so that restrictor valve 228 can function better. In other instances where the vapor pressure of the precursor composition is sufficiently low, it may not be necessary to use a restrictor valve 228, and only the first variable aperture valve 226 is used.

Downstream from variable aperture valve 228 is a limited volume chamber which may be expansion volume 122, or 134, or 146, of the kind shown in FIG. 1. Gaseous impurities exiting precursor composition supply vessel 222 from the vapor space (not shown) over a liquid precursor composition (not shown) may be collected in expansion volume 122, or 134, or 146, for example, and not by way of limitation. A pressure sensor 231 is in communication with the limited volume chamber. The pressure sensor 231 senses the pressure in a limited volume chamber, such as expansion volume 134, which pressure is an indication of the summation of all of the partial pressures of the gas and vapor components present in expansion volume chamber 134. This pressure is compared to the pressure which would be present for nominally pure reactive precursor, and if the sensed pressure is greater than that of the nominally pure reactive precursor, then the precursor composition must be processed to remove impurities.

If the pressure in expansion volume chamber 134 is higher than that for the nominally pure precursor, optional valve 232, or in the alternative, a combination of line valve 234 and exhaust valve 236 may be opened to permit removal of impurity gaseous materials present in expansion volume 134, for example. The removal is facilitated by application of a vacuum (not shown) downstream of optional valve 232 or downstream of exhaust valve 236. When optional valve 232 is not used, the impurity gaseous materials pass through coating process chamber 102, which preferentially is maintained at a temperature which is sufficiently high that the impurity gaseous materials will not condense in coating process chamber 102. In the event of an unexpected condensation of impurities into coating process chamber 102, the chamber may be cleaned using an oxygen-based or water-based plasma and/or heated under vacuum.

An alternative embodiment of apparatus for processing of precursor compositions to remove impurities is shown in FIG. 2B. The apparatus shown in FIG. 2B permits impurity removal without exposing either the coating process chamber 102 or an expansion volume, 122 or 134, or 146 to the gaseous impurities during their exhaust from the processing apparatus. The FIG. 2B apparatus 200 includes a supply vessel 202, which may be a container provided by a supplier, or which may be a precursor holding vessel which is periodically emptied and refilled with a precursor composition. In direct communication with supply vessel 202 is a valve 204 which is typically a shut off valve used when complete isolation of the supply vessel 202 is required. The shut off valve 204 may be used to provide an aperture through which gaseous materials present in a vapor space over the liquid precursor composition are passed as a part of the present method of purifying a precursor composition to produce a nominally pure reactive precursor for use in a layer deposition. However, typically during precursor composition processing, the shut off valve is used in open position, and a second downstream variable aperture valve is provided, which provides an aperture which is more precisely controlled. As previously discussed, the "variable aperture valve" may be a single valve or may be a series of valves, from which one valve is selected, depending on the range in vapor pressures of precursor compositions which may be used in the apparatus.

FIG. 2B shows two variable aperture valves in series, by way of example and not by way of limitation. Variable aperture valve 206 is a general variable aperture valve which may be used for processing of lower vapor pressure precursor compositions. Variable aperture valve 208 is a restrictor valve which is useful in restricting higher vapor pressure precursor compositions. In some instances where the vapor pressure of the precursor composition is sufficiently low, it may not be necessary to use a restrictor valve 208.

Downstream from variable aperture valve 208 is a limited volume chamber 210 in which gaseous materials exiting supply vessel 202 from the vapor space (not shown) over a liquid precursor composition (not shown) are collected. A pressure sensor 211 is in communication with limited volume chamber 210. The pressure sensor 211 senses the pressure in limited volume chamber 210, which pressure is an indication of the summation of all of the partial pressures of the gaseous components present in limited volume chamber 210. This pressure is compared to the pressure which would be present for nominally pure reactive precursor, and if the pressure in limited volume chamber 210 is higher than the vapor pressure of nominally pure reactive precursor, then the precursor composition must be processed to remove impurities.

If the pressure is higher than that for nominally pure precursor, optional bypass valve 212, or in the alternative, a combination of line valves 214 and exhaust valve 216 may be opened to permit removal of gaseous materials present in limited volume chamber 210. The removal is facilitated by application of a vacuum (not shown) downstream of optional bypass valve 212 or downstream of exhaust valve 216. When optional bypass valve 212 is used, impurity gases exit the system without passing into chamber 218. Chamber 218 may be a general gaseous impurity collection chamber or may be an expansion volume 122 or 134 or 146, of the kind shown in FIG. 1. Depending on the particular application, gaseous materials present in limited volume chamber 210 are passed directly through an expansion volume 122, 134, or 146 to reach exhaust valve 216. In some instances, the vacuum system downstream of exhaust valve 216 may be in communication through an exhaust port off a coating process chamber 102 of the kind shown in FIG. 1.

II. Volatile Impurity Removal from Low Vapor Pressure Liquids

Many of the low vapor pressure (less than about 150 Torr) liquid precursor compositions may be purified using liquid precursor compositions which are at/heated to temperatures in the range of about 20° C. to about 120° C. The maximum temperature at which a liquid precursor composition may be purified is the boiling temperature of the liquid precursor composition at the pressure in the precursor composition supply vessel, or the precursor decomposition/polymerization temperature. However, it is not recommended that such a high temperature be used during purification, due to the possibility of foaming and liquid carry-over as vapors from the precursor composition supply vessel pass through the variable aperture valve. In addition, the use of high temperatures to raise the vapor pressure of the precursor composition may lead to reaction of the precursor and the formation of undesirable reaction products. At the same time, it is necessary to heat all fluid flow conduits within the system to a temperature higher than the precursor composition supply vessel, to prevent condensation of the gaseous composition which is generated during the purification process.

Prior to beginning any of the exemplary processes described below for removal of impurities from precursor compositions, it is necessary to leak check the portions of the system which are under sub-atmospheric pressure during processing operations. It is recommended that the vacuum leak rate for the various lines and vessels which come under sub-atmospheric pressure not exceed about 1 mTorr/minute.

Example One

Removal of Protective Gases from Precursor Composition Supply

Freshly filled supply cylinders provided by vendors, which act as the precursor composition supply vessel, are frequently pressured with an inert gas such as nitrogen at atmospheric pressure to provide a "blanket" over the precursor composition, which prevents the entry of contaminants from ambient. When a blanketing gas is used to protect the precursor composition, the precursor purification process can be used to remove the blanketing gas. When the precursor composition supply vessel is one which is emptied and refilled, gaseous impurities present in tank trucks or from rail tankers may require similar removal of protective gases.

The procedure for protective gas removal is as follows, with reference to FIG. 2B:

1) With shut off valve 204 closed, and downstream optional bypass valve 212 (if present) and line valve 214 closed, the fluid flow conduits between the shut off valve 204 and the vacuum (pressure) sensor 211 are pumped down (vacuum is applied). This requires that the restrictor valve 208 and variable aperture valve 206 are open.

2) A baseline pressure is then sensed and recorded.

3) Subsequently, variable aperture valve 208 is closed.

4) Then, shut off valve 204 is opened a fraction (typically about 25%±10% of full open) to release a portion of the volatile gases trapped in the precursor composition supply vessel 202 into the conduit 203 and 205 between shut off valve 204 and variable aperture valve 208.

5) The shut off valve is then closed. Typically the time period required to release a portion of the volatile gases is less than about 5 seconds.

6) Variable aperture valve 208 is then opened so that the limited volume chamber 210 is filled.

7) The pressure in the limited volume chamber 210 is then sensed and recorded.

8) Bypass valve 212 or line valve 214 and exhaust valve 216 are then opened and the limited volume chamber 210 and conduit lines in communication with limited volume chamber 210 are pumped down, back to the initial baseline pressure.

9) If the pressure sensed and recorded in step 7) prior to the evacuation of the limited volume chamber 210 was the maximum pressure which can be sensed by the pressure sensor 211, then:

10) Bypass valve 212 or line valve 214 and exhaust valve 216 are closed.

11) Variable aperture valve 208 is closed.

12) Steps 4)-11) are repeated until the pressure measured in step 7) drops below the maximum range of pressure sensor 211.

If the pressure sensor maximum is lower than the vapor pressure of the gases and vapor in the precursor composition supply vessel at room temperature, steps 4)-11) will typically need to be repeated at in the range of 20±10 times.

Example Two

Removal of Impurities from a Precursor Composition at Room Temperature

After the protective gases, or air, or other vapors have been removed to the extent that the pressure sensor maximum is not exceeded by the gaseous materials exiting the liquid precursor composition supply vessel, it is possible to proceed with the removal of other impurities present in the liquid precursor composition.

Subsequent to the steps shown in EXAMPLE ONE above, impurity removal with the precursor composition at room temperature is as follows, with reference to FIG. 2B:

1) With shut off valve 204 open 100% and variable aperture valve 206 opened 100%, restrictor valve 208 is opened for a time period ranging from about 5 seconds to about 60 seconds (typically 30 seconds is adequate) to release a portion of the volatile gases from the precursor composition supply vessel 202 through the conduits 203 and 205 into the limited volume chamber 210. (Exhaust valve 212 (if present) and line valve 214 are closed.)

2) The restrictor valve 208 if present, and/or variable aperture valve 206 are then closed.

3) The pressure in the limited volume chamber 210 is then sensed and recorded.

4) Bypass valve 212 or line valve 214 and exhaust valve 216 are then opened and the limited volume chamber 210 and any open conduit line(s) in communication with limited volume chamber 210 are pumped down, back to the initial baseline pressure.

5) Steps 1-4 are then repeated until two consecutive pressures sensed in step 3) differ by less than about 50 mTorr, which indicates that a stabilized nominal impurity level achievable at room temperature has been obtained for the precursor composition in precursor composition supply vessel 202.

Example Three

Removal of Impurities from a Precursor Composition at Elevated Temperature

The method of the invention is typically used to remove additional impurities from the precursor composition up to about the temperature at which the reactive precursor is to be used during deposition of a thin film/layer. This reduces the effect on the deposited layer of remaining impurities which are present in the reactive precursor during deposition of the layer.

Figure 3A:
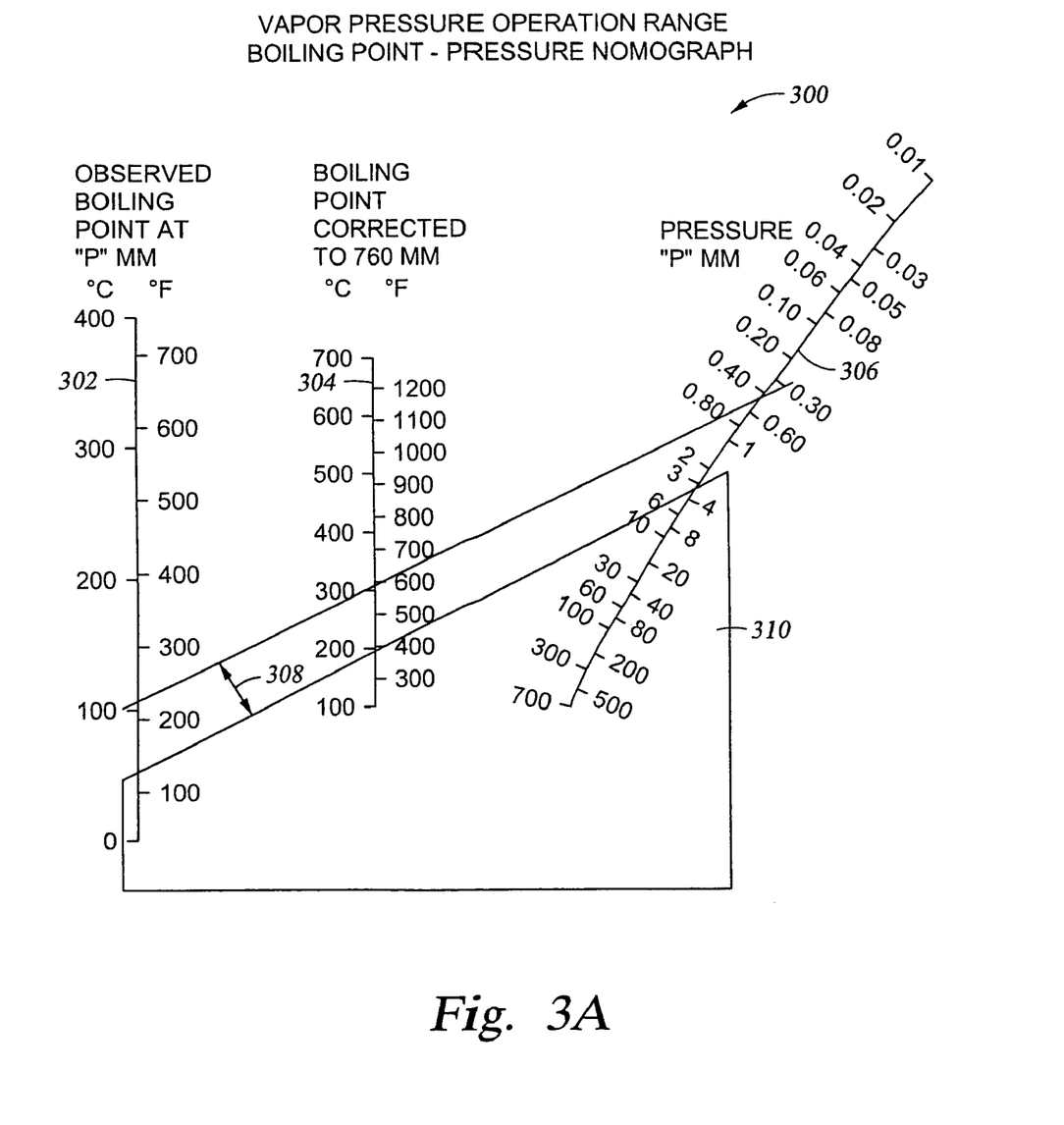
FIG. 3A shows a boiling point-pressure nomograph 300 which enables one skilled in the art to correlate the normal boiling point of a compound (precursor material) with its approximate boiling point at any given sub-atmospheric pressure. Column 302 represents the precursor boiling point at pressure P mm. Column 304 represents the precursor boiling point at 760 mm. Curve 306 represents the pressure P mm at which it is desired to know the boiling point of the precursor.
Figure 3B:
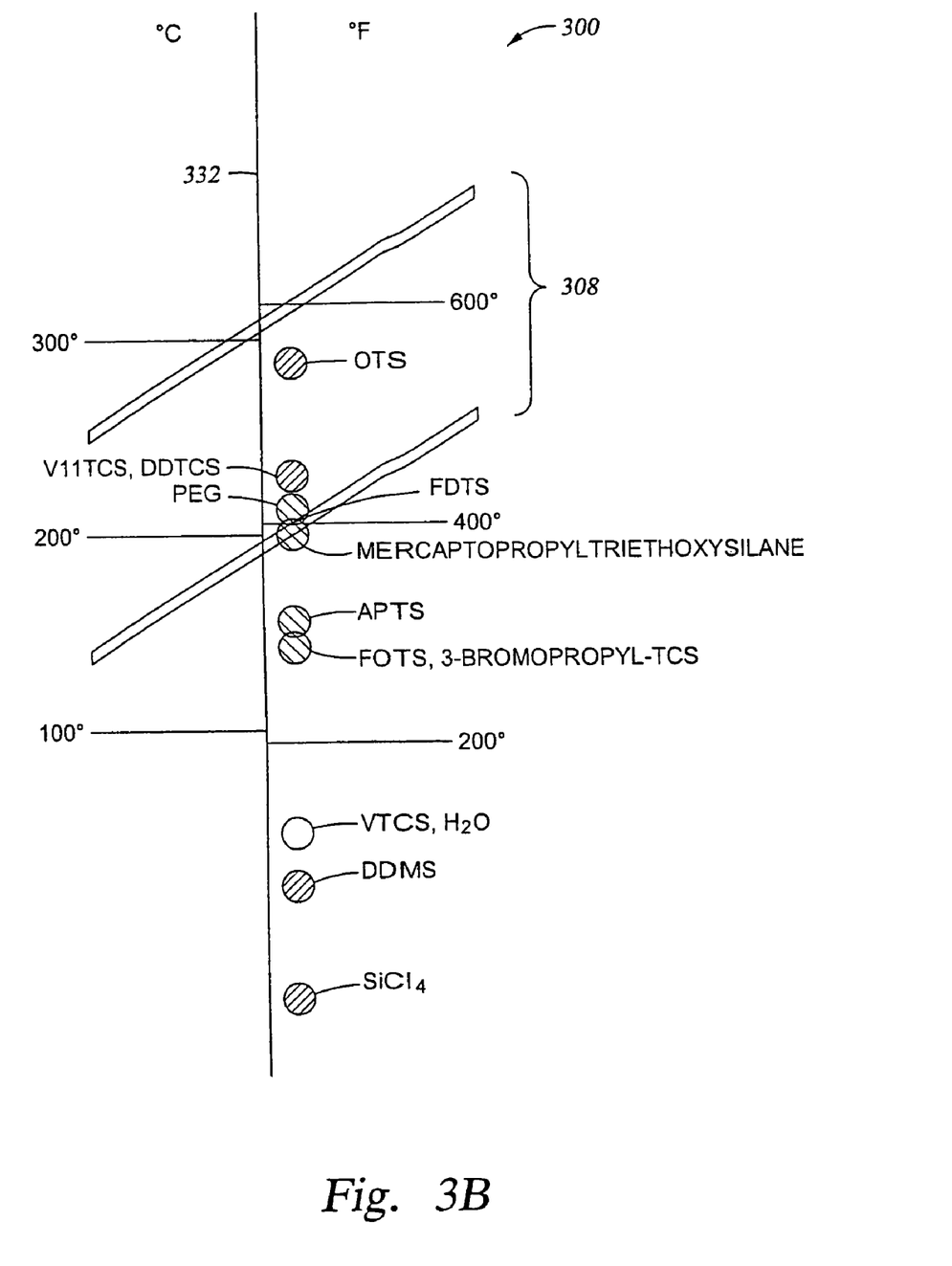
FIG. 3B shows a graph 300 which illustrates the boiling point at 760 mm for a number of precursor materials which are exemplary precursors of interest in the formation of vapor deposited coatings.

One skilled in the art, will be able to determine the boiling point of a given liquid reactant precursor at a given subatmospheric pressure which is present in the limited volume container (typically the expansion volume, 122, 134, or 146) by using a combination of tools such as those shown in FIGS. 3A and 3B. (The theoretical vapor pressure of the reactant precursor will equal that of the pressure in the expansion volume at that temperature.) FIG. 3A shows a nomograph 300, which illustrates the relationship between a boiling point at 760 mm (760 mm=760 Torr at 0° C.) shown on Curve 304, a pressure "p" mm shown on Curve 306 (which pressure may be subatmospheric), and the boiling point which can be expected at "p" mm, which is shown on Curve 302. Given a liquid reactant precursor with a specified boiling point at 760 mm, one skilled in the art can use this nomograph to predict what the boiling point would be at a sub-atmospheric pressure. The boiling points for a number of the kinds of liquid reactant precursors which might be used in the present invention at 760 mm is shown in FIG. 3B. By taking a liquid reactant precursor boiling point at 760 mm from FIG. 3B, and finding this point on Curve 304, knowing the pressure "P" at which a layer deposition is likely to be carried out, it is possible to determine the temperature to which the liquid reactant precursor should be heated to remove gases and impurities, from Curve 302.

In general, volatile impurity removal from a low to mid range vapor pressure liquid coating precursor is carried out in the manner described in the summary of invention provided above. An example is provided below.

A reactant precursor low range vapor pressure (at room temperature) is in the range of less than about 100 mTorr. A reactant precursor mid range vapor pressure is in the range of about 100 mTorr up to about 1 Torr. Impurity removal with the precursor composition at elevated temperature is as follows, with reference to FIG. 2B:

1) An initial impurity removal at room temperature in the manner described with respect to Example Two must be performed prior to an elevated temperature impurity removal. With reference to FIG. 2B, at the end of this procedure, valves 204 and 208 are open.

2) All line and vessel temperatures should be maintained at a temperature which is in the range of about 0° C. to about 50° C. higher than the maximum temperature at which the impurity removal is to be carried out, to minimize condensation.

3) With the variable aperture valve 206 closed, and downstream bypass valve 212 (if present) and/or line valve 214 and exhaust valve 216 opened, the conduits between variable aperture valve 206 and the vacuum (pressure) sensor 211 are pumped down (vacuum is applied). This requires that the restrictor valve 208 is open.

4) The bypass valve 212 and/or at least line valve 214 (and exhaust valve 216 if desired), are subsequently closed.

5) The precursor composition supply vessel 202 temperature is raised to approximately 40° C. using a heating jacket or other acceptable method. This typically requires a time period of about 15-20 minutes at an acceptable heating rate, although an acceptable heating rate will depend on whether agitation is available in precursor composition supply vessel 202.

6) The restrictor valve 208 is then opened for a time period in the range of about 5 seconds to about 60 seconds (typically for about 30 seconds) to permit limited volume chamber 210 to fill with impurities generated from the precursor composition. (Variable aperture valve 206 and restrictor valve 208 may be interchanged in position from that shown in FIG. 2B, and a single valve 206 or 208 may be used, depending on the application.)

7) The restrictor valve 208 if present, and/or the variable aperture valve 206 are then closed.

8) The pressure in limited volume chamber 210 is sensed and recorded.

9) The bypass valve 212 and/or line valve 214 and exhaust valve 216 are opened and the limited volume chamber 210 is pumped down to line pressure.

10) Bypass valve 212 and/or line valve 214 (and exhaust valve 216 if desired) are closed.

11) Steps 6-10 are repeated until two consecutive pressure readings for limited volume chamber 210 differ by less than about 50 mTorr, which indicates that no more impurities are being released at this temperature.

12) The entire procedure recited above is repeated, with step 5) being substituted with an incremental increase in the temperature of precursor composition supply vessel 202 from about 2° C. up to about 40° C. (typically about 20° C.), until the desired elevated temperature of the precursor composition (and supply vessel) used for layer deposition is achieved.

Figure 4:
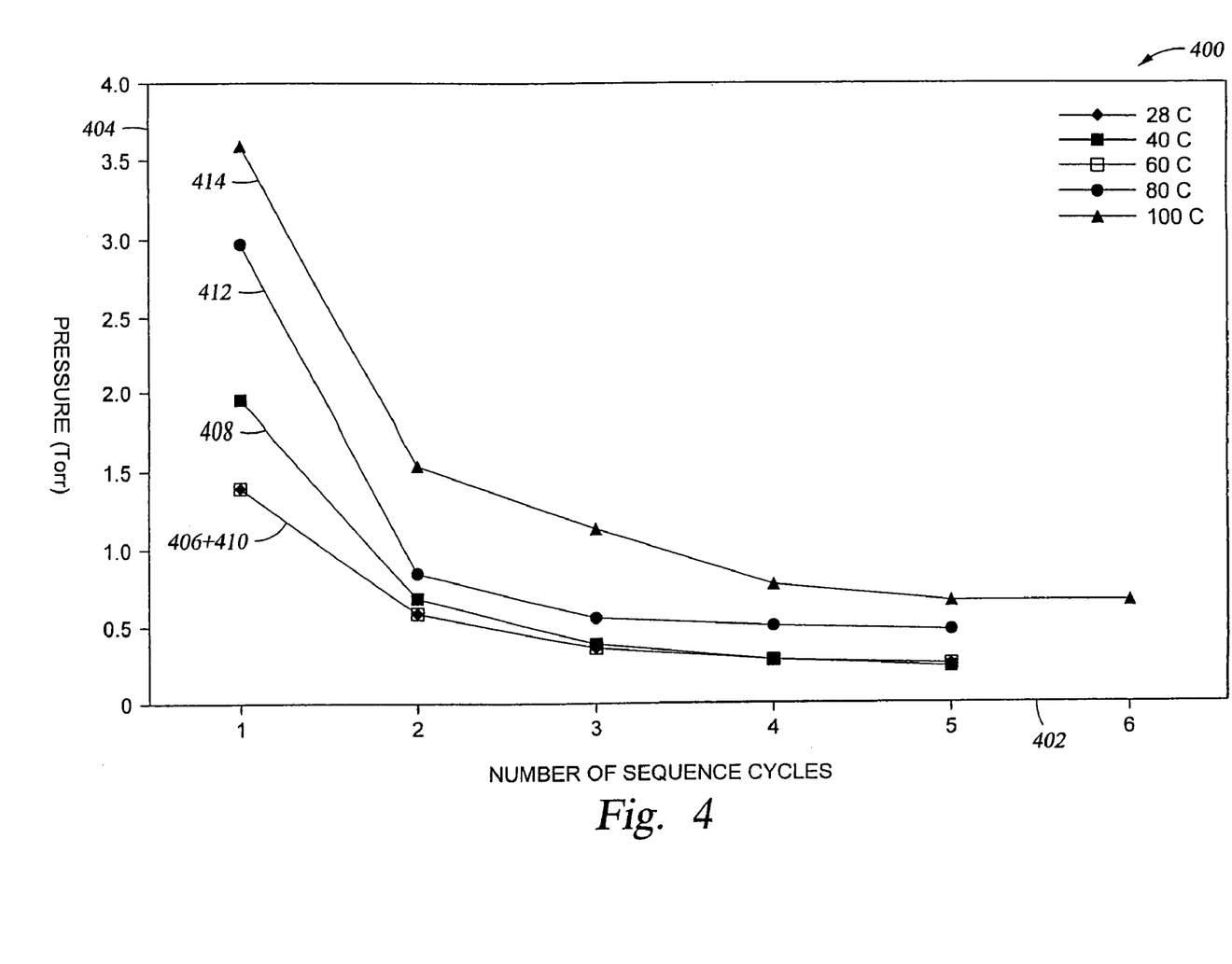
FIG. 4 shows a graph 400 which illustrates the number of sequential precursor purification cycles required to approach a desired nominal purity of reactant precursor as a function of the initial pressure of the precursor composition, as measured in the limited volume. In addition, graph 400 shows the amount of pressure drop as a function of each purification cycle.

FIG. 4 shows a graph 400 which illustrates the typical number of vapor expansion cycles required to remove impurities for a mid vapor pressure range reactant precursor composition, FOTS (tridecafluoro-1,1,2,2,-tetra hydrooctyl trichlorosilane), i.e. a precursor composition which exhibits a vapor pressure ranging from about 100 mTorr to 1 Torr, using the method of the invention. Graph 400 shows the vapor pressure (in Torr) of the precursor composition on axis 404, as a function of the number of purification cycles on axis 402. A number of different curves are provided, where each curve represents processing of the precursor composition at a given temperature. For example, Curve 406 illustrates processing of the precursor composition at 28° C.; Curve 408 illustrates processing of the precursor composition at 40° C.; Curve 410 illustrates processing of the precursor composition at 60° C.; Curve 412 illustrates processing of the precursor composition at 80° C.; and, Curve 414 illustrates processing of the precursor composition at 100° C. For a mid vapor pressure reactant precursor composition of this kind, about 4 cycles is generally adequate. As is evident from FIG. 4, with respect to a given precursor composition, taking the precursor composition to a higher temperature for impurity removal generally increases the number of cycles required. This makes it advantageous to take the precursor composition to the minimal processing temperature which will provide the desired purification of the precursor composition. Although other mid vapor pressure range precursors will exhibit a different vapor pressure at a given temperature, it is expected that the general relationship between the vapor pressure of the precursor composition and the number of purification sequence cycles will be similar.

Example Four

Removal of Impurities from a Precursor Composition at Decreased Temperature, Down to Freezing For a high vapor pressure liquid precursor composition, for example and not by way of limitation, a vapor pressure in excess of 1 Torr at room temperature, it is recommended that the liquid precursor composition be cooled below room temperature to make use of the impurity removal process described above. (Where the temperature of processing may be gradually increased as the processing continues, depending on the application.) When the vapor pressure of the liquid precursor composition is in the range of 20 Torr and higher, it is recommended that the liquid precursor composition be processed using a cycle which involves temporary freezing of the precursor composition. The steps in a method which makes use of a freezing technique are provided below, with reference to FIG. 2B.

1) With shut off valve 204 closed, and downstream bypass valve 212 (if present) and/or line valve 214 and exhaust valve 216 opened, the fluid flow conduits between the shut off valve 204 and the vacuum (pressure) sensor 211 are pumped down (vacuum is applied). This requires that the restrictor valve 208 and variable aperture valve 206 are open.

2) The bypass valve 212 and/or at least line valve 214 (and exhaust valve 216 if desired), as well as all valves downstream of the liquid precursor supply vessel 204 are closed.

3) The liquid precursor composition supply vessel is then cooled until the liquid precursor composition becomes frozen. The freezing temperature will be a function of the precursor material.

4) The variable aperture valve 206 and restrictor valve 208 are then opened.

5) Bypass valve 212 and/or line valve 214 and exhaust valve 216 are opened and the limited volume chamber 210 and the conduits down to the precursor composition supply vessel 202 are pumped down to line pressure (typically in the range of about 1 mTorr to about 30 mTorr, depending on the pumping system).

6) Optionally, restrictor valve 208 if present, and/or variable aperture valve 206 are then closed.

7) Warm or permit warming of the precursor composition supply vessel 202 to produce vapor. (Typically the contents are warmed up to room temperature.)

8) Steps 3) through 7) are repeated two to three times.

After the degassing procedure described above, the high vapor pressure liquid precursor compositions are typically used at room temperature. The variable aperture valve 206 or a combination of variable aperture valve 206 and restrictor valve 208 are set to provide a rise in vapor pressure in a vapor reservoir (218) such as expansion volumes 122 or 134, or 146 at a rate of about 1-10 Torr/second.

The above described exemplary embodiments are not intended to limit the scope of the present invention, as one skilled in the art can, in view of the present disclosure expand such embodiments to correspond with the subject matter of the invention claimed below.

We claim:

1. A method of in-line removal of impurities from a liquid precursor composition which is used to generate reactive precursor vapors for deposition of a thin film, layer, or coating at sub-atmospheric pressure, said method comprising the steps of:
   a) passing a vapor from a vapor space over a surface of said liquid precursor composition, which is in a supply vessel, through at least one aperture, which is in-line between said supply vessel and a thin film deposition process chamber, in a manner such that said precursor composition vapor expands into a lower pressure, confining environment;
   b) collecting said precursor composition vapor in said confining environment;
   c) sensing a pressure of said precursor composition vapor in said confining environment;
   d) comparing said sensed pressure with an indicated desired nominal pressure or with a change in pressure; and
   e) exhausting and discarding said precursor composition vapor from said confining environment when said precursor composition vapor does not meet requirements with respect to said indicated desired nominal pressure or said change in pressure.

2. A method in accordance with claim 1, wherein said aperture is a conduit or a path through a valve.

3. A method in accordance with claim 2, wherein said valve is selected from the group consisting of a solid wedge gate valve, a flexible wedge gate valve, a globe valve, a diaphragm valve, a ball valve, a butterfly valve, a needle valve, and a restricting orifice.

4. A method in accordance with claim 3, wherein a control valve is used and an actuator is used in combination with a valve selected from the group.

5. A method in accordance with claim 1, including an additional step:
   f) repeating steps a) through e) until said sensed pressure corresponds sufficiently with a desired indicated nominal pressure or with a desired change in pressure to meet requirements related to a reactive precursor vapor for deposition of a thin film, layer, or coating at sub-atmospheric pressure.

6. A method in accordance with claim 5, wherein a temperature of the liquid precursor composition at which said reactive precursor vapor is generated is at least within about 10° C. of the boiling point of the liquid precursor composition at the pressure which is initially present in the lower pressure confining environment.

7. A method in accordance with claim 5, wherein temperature of the liquid precursor composition is such that the precursor composition is capable of producing sufficient vapor to achieve a rate of increase in pressure in the lower pressure confining environment which ranges between about 0.5 Torr/second to about 4.0 Torr/second.

8. A method in accordance with claim 6 or claim 7, wherein said temperature ranges from about 20° C. to about 150° C. .

9. A method in accordance with claim 8 wherein said liquid precursor composition is at a temperature ranging from about 20° C. to about 120° C. when said vapor in said vapor space is generated.

10. A method in accordance with claim 1, or claim 5, or claim 6, or claim 7, wherein said liquid precursor composition has a vapor pressure of about 250 Torr or less at 25° C. .

* * * * *